(12) United States Patent
Chiu (10) Patent No.: US 6,965,163 B2
(45) Date of Patent: Nov. 15, 2005

(54) SUBSTRATE-LESS MICROELECTRONIC PACKAGE

(75) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/916,022

(22) Filed: Aug. 10, 2004

(65) Prior Publication Data

US 2005/0006787 A1   Jan. 13, 2005

Related U.S. Application Data

(63) Continuation of application No. 10/421,310, filed on Apr. 22, 2003, now Pat. No. 6,794,748.

(51) Int. Cl.[7] .............................................. H01L 23/34
(52) U.S. Cl. ....................................... 257/706; 257/777
(58) Field of Search ................................. 257/706, 777

(56) References Cited

U.S. PATENT DOCUMENTS

| | | | |
|---|---|---|---|
| 5,910,682 A | 6/1999 | Song | |
| 6,081,028 A * | 6/2000 | Ettehadieh et al. | 257/713 |
| 6,265,771 B1 | 7/2001 | Ference et al. | |
| 6,339,254 B1 | 1/2002 | Venkateshwaran et al. | |
| 6,369,448 B1 * | 4/2002 | McCormick | 257/777 |
| 6,590,281 B2 * | 7/2003 | Wu et al. | 257/684 |
| 6,665,187 B1 | 12/2003 | Alcoe et al. | |
| 2003/0148554 A1 * | 8/2003 | Gerber et al | 438/122 |

* cited by examiner

Primary Examiner—David Nelms
Assistant Examiner—Tu-Tu Ho
(74) Attorney, Agent, or Firm—Rob G. Winkle (57) ABSTRACT

A microelectronic die assembly including a heat dissipation device serving as a support structure for the assembly is described. A first microelectronic die is attached by a back surface to a first surface of the heat dissipation device. A first plurality of interconnects are disposed on an active surface of the first microelectronic die. A second microelectronic die is attached by a back surface to the first microelectronic die active surface. A second plurality of interconnects are disposed on an active surface of the second microelectronic die. Any appropriate number of microelectronic dice may be stacked in a like fashion.

22 Claims, 5 Drawing Sheets

SUBSTRATE-LESS MICROELECTRONIC PACKAGE

CROSS REFERENCE TO RELATED APPLICATION

This application is a continuation of U.S. patent application Ser. No. 10/421,310 filed Apr. 22, 2003 now U.S. Pat. No. 6,794,748.

BACKGROUND OF THE INVENTION

1. Field of the Invention

The present invention relates to apparatus and methods for fabricating microelectronic packages. In particular, the present invention relates to low profile microelectronic packages, which are fabricated without a substrate.

2. State of the Art

Higher performance, reduced cost, increased miniaturization of integrated circuit components, and greater packaging densities of microelectronic devices are ongoing goals of the microelectronics industry. One method of increasing the density of microelectronic device packages is to stack the individual microelectronic dice within the packages. Furthermore, low-profile (thin) microelectronic packages are in high demand for use in small electronic devices, such as cell phones. Thus, the microelectronics industry fabricates a variety of thin, stacked packages.

Figure 8:
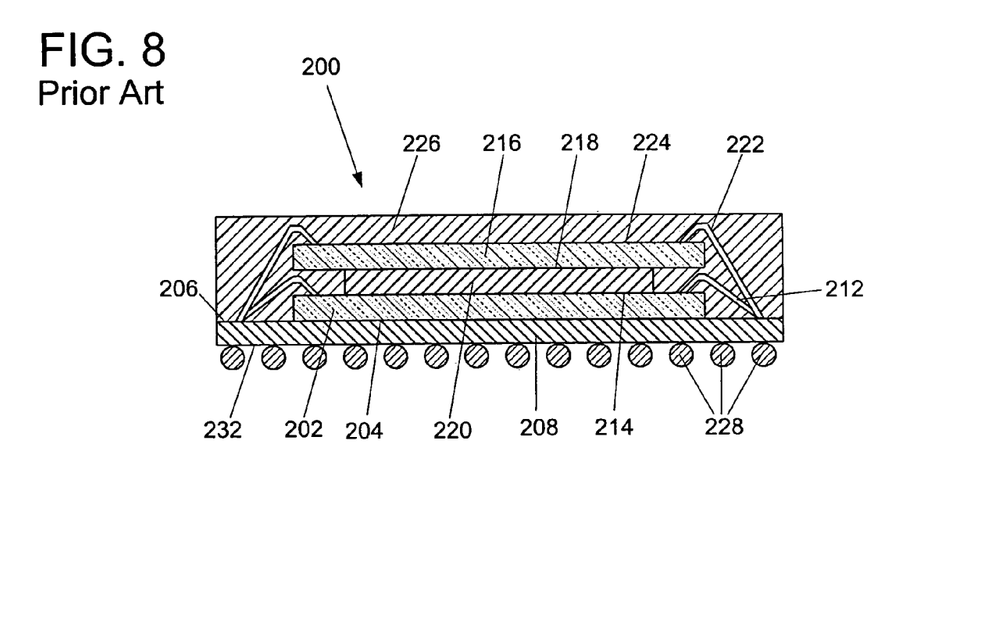
FIG. 8 is a side cross-sectional view of a ultra thin molded matrix array package, as known in the art.

FIG. 8 illustrates one such package known as an Ultra Thin Molded Matrix Array Package (UTMMAP). The UTMMAP 200 comprises a first microelectronic die 202 (such as a microprocessor, a chipset, a memory device, an ASIC, and the like) attached by its back surface 204 to a first surface 206 of a carrier substrate 208 (such as an interposer, a motherboard, a back surface of another microelectronic die, or the like). A first plurality of bond wires 212 extend from bond pads (not shown) on an active surface 214 of the first microelectronic die 202 to land pads (not shown) on the carrier substrate first surface 206 to make electrical contact therebetween, as will be understood by those skilled in the art. A second microelectronic die 216 is stacked by its back surface 218 on the first microelectronic die 202 with an appropriately sized spacing device 220 disposed therebetween to allow clearance for the first bond wires 212. The second microelectronic die 216 makes electrical contact with the carrier substrate 208 through a second plurality of bond wires 222 extending between bond pads (not shown) on an active surface 224 of the second microelectronic die 216 and land pads (not shown) on the carrier substrate 208. The stacked microelectronic dice are then encapsulated with a molding compound 226. The carrier substrate 208 also includes a plurality of external contacts 228 attached to a second surface 232 thereof. These external contacts 228 are used to connect the package to an external component (no shown), as will be understood to those skilled in the art.

Figure 9:
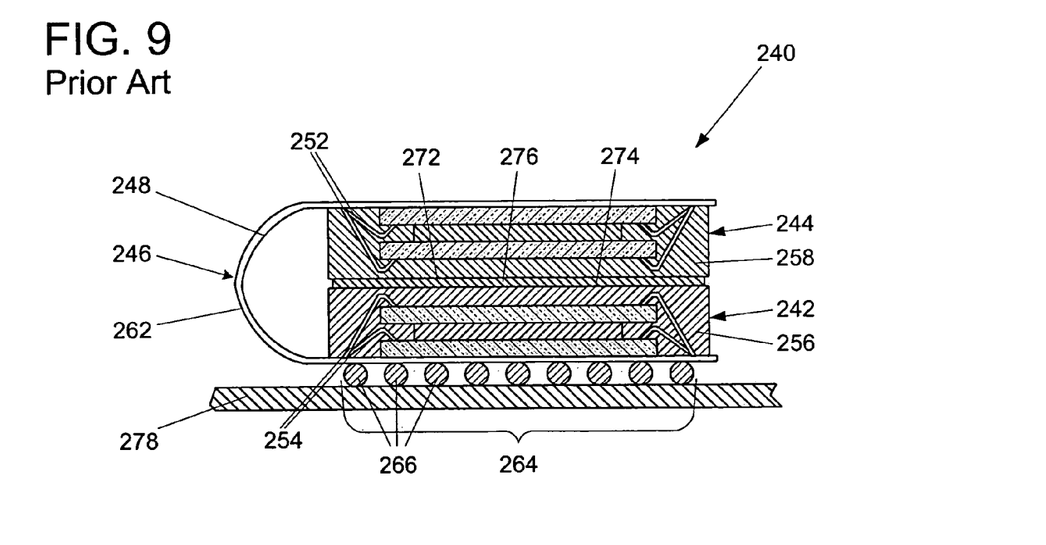
FIG. 9 is a side cross-sectional view of a folded flex ball grid array package, as known in the art.

Another thin, stacked package configuration is known as a Foiled Flex Ball Grid Array (FF-BGA). Such a package includes the use of a flexible substrate to route electrical traces from the second microelectronic dice stack to a position between the first microelectronic dice stack and the carrier substrate to make electrical contact therewith. FIG. 9 shows such an FF-BGA package 240, wherein a first microelectronic dice stack 242 and a second microelectronic dice stack 244 are attached to and in electrical contact with a first surface 248 of a flexible substrate 246 through wire bonds 252 and 254, respectively. The first microelectronic dice stack 242 and second microelectronic dice stack 244 may be fabricated in a manner discussed above with regard to the UTMMAP 200 of FIG. 8. A molding compound 256, 258 is dispersed proximate each of the first microelectronic dice stack 242 and the second microelectronic dice stack 244, respectively.

The flexible substrate 246 includes conductive traces (not shown) disposed therein, thereon, and/or therethrough, which make contact with an array 264 of external interconnects 266 (such as solder balls) disposed on a second surface 262 of the flexible substrate 246 proximate the first microelectronic dice stack 242. Thus, both the first microelectronic dice stack 242 and the second microelectronic die stack 244 have external interconnects 266 within the array 264. The flexible substrate 246 is bent such that a back surface 272 of the first microelectronic dice stack 242 can be attached to a back surface 274 of the second microelectronic dice stack 244 with a layer of adhesive 276. The external interconnects 266 are attached to a substrate 278 using a C4 (controlled collapse chip connect) process.

Although such approaches result in effective thin, stacked packages, these packages have poor thermal performance (i.e., do not dissipate heat well from the microelectronic dice therein) due to the poor thermal conductivity of the molding compound and carrier substrates used by these packages. Therefore, it would be advantageous to develop a thin, stacked package that is capable of effective thermal dissipation.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a microelectronic die assembly having a heat dissipation device serving as a support structure for the assembly. A first microelectronic die is attached by a back surface to a first surface of the heat dissipation device. A first plurality of interconnects are disposed on an active surface of the first microelectronic die. A second microelectronic die is attached by a back surface to the first microelectronic die active surface. A second plurality of interconnects are disposed on an active surface of the second microelectronic die. Any appropriate number of microelectronic dice may be stacked in a like fashion.

Figure 1:
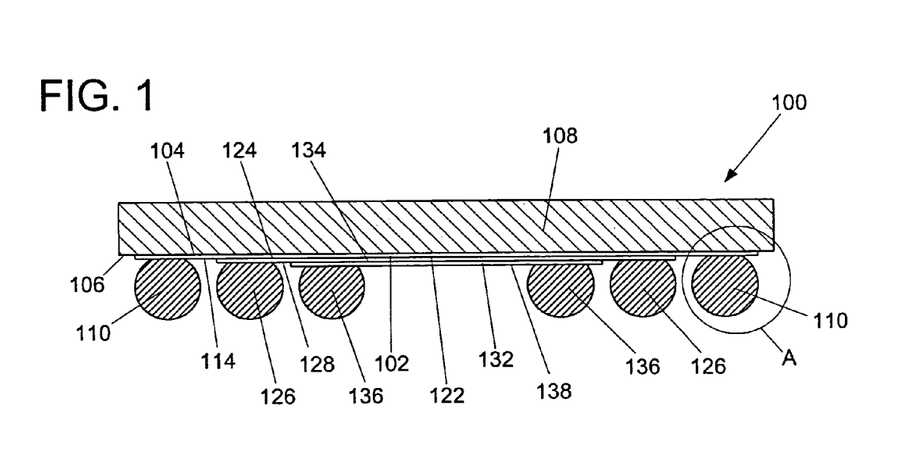
FIG. 1 is a side cross-sectional view of an embodiment of a microelectronic die assembly, according to the present invention.
Figure 2:
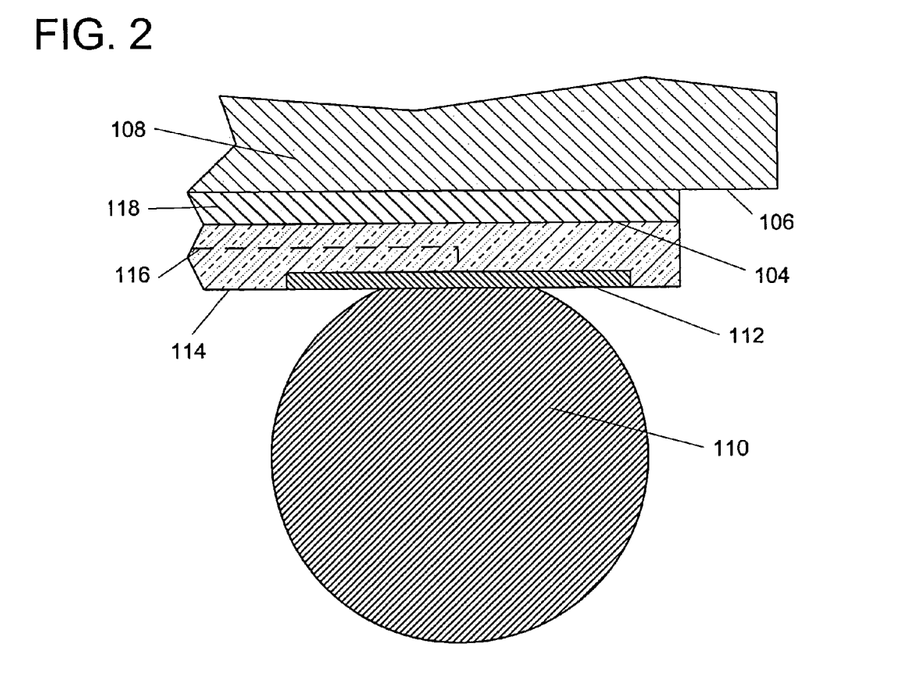
FIG. 2 is a side cross-sectional view of inset A of FIG. 1, according to the present invention.

FIGS. 1 and 2 illustrate an embodiment, according to the present invention, of a microelectronic die assembly 100 comprising a first microelectronic die 102 physically attached by a back surface 104 thereof to a first surface 106 of a heat dissipation device 108 (illustrated as a heat slug) with thermally conductive adhesive 118 (shown in FIG. 2). The heat dissipation device 108 is preferably constructed from a highly thermally conductive material, such as copper, copper alloys (such as copper tungsten alloys), aluminum, aluminum alloys, aluminum silicon carbon composites, anisotropic materials (such as carbon fiber), and the like. The heat dissipation device may be between about 0.5 and 1.5 mm thick depending on the height constraints for the microelectronic die assembly 100. The microelectronic dice employed in the present invention may include, but are not limited to, central processing units (CPUs), chipsets, memory devices, ASICs, and the like. Additionally, the microelectronic dice employed in the present invention may be between about 50 and 70 $\mu$m thick. The thermally conductive adhesive 118 may be, but is not limited to, epoxies, solders, and the like.

The first microelectronic die 102 has at least one conductive interconnect 110 attached to at least one bond pad 112 (see FIG. 2) disposed on and/or in an active surface 114 of the first microelectronic die 102. The conductive interconnects 110 may be a solder material (such as lead, tin, indium, gallium, bismuth, cadmium, zinc, copper, gold, silver, antimony, germanium, and alloys thereof), conductive particle filled polymers (such as copper particles in epoxy), or the like. The bond pad 112, preferably a metal such as copper, gold, and the like, is electrically connected by a trace (shown as dashed line 116), to circuitry (not shown) within the first microelectronic die 102.

Figure 10:
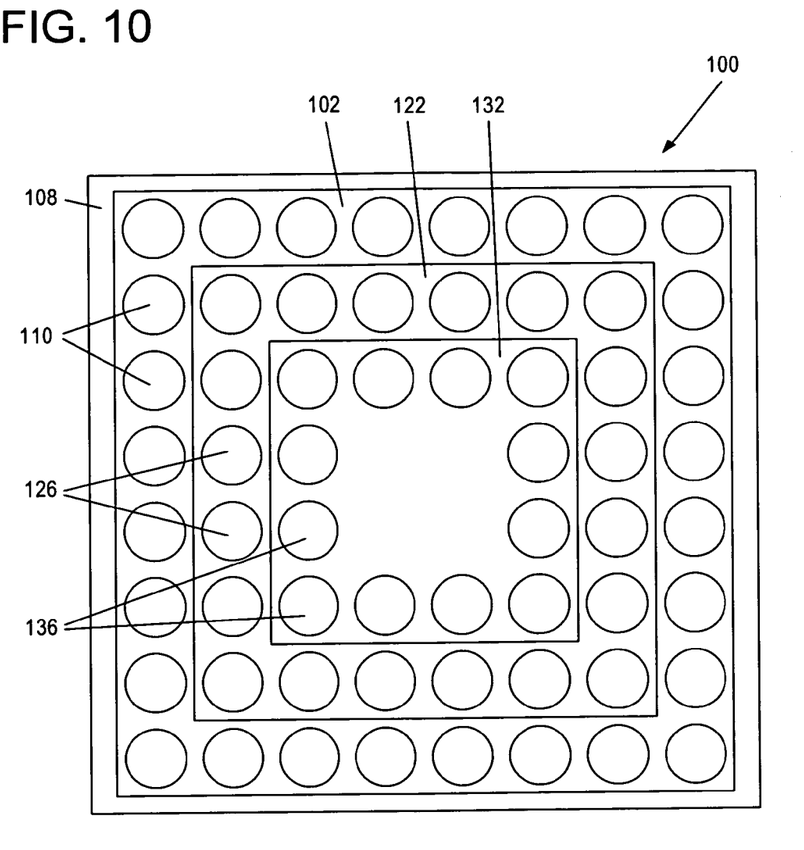
FIG. 10 is a bottom plan view of FIG. 1, according to the present invention.

Referring back to FIG. 1, a second microelectronic die 122 is physically attached by a back surface 124 thereof to the first microelectronic die active surface 114. The second microelectronic die 122 has at least one conductive interconnect 126 attached to a bond pad (not shown) disposed on and/or in an active surface 128 of the second microelectronic die 122 (similar to that shown in FIG. 2). Of course, the second microelectronic die 122 must be appropriately sized to prevent contact with the first microelectronic die interconnects 110. It is, of course, understood that the first microelectronic die interconnects 110 are positioned proximate a periphery of the first microelectronic die 102 to maximize the attachment surface for the second microelectronic die 122, as shown in FIG. 10.

A third microelectronic die 132 may be physically attached by a back surface 134 thereof to the second microelectronic die active surface 128. The third microelectronic die 132 has at least one conductive interconnect 136 attached to a bond pad (not shown) disposed on and/or in an active surface 138 of the third microelectronic die 132 (similar to that shown in FIG. 2). Again, the third microelectronic 132 must be appropriately sized to prevent contact with the second microelectronic die interconnects 126. It is, of course, understood that the second microelectronic die interconnects 126 are positioned proximate a periphery of the second microelectronic die 122 to maximize the attachment surface for the third microelectronic die 132, as shown in FIG. 10. It is further understood that any number of microelectronic dice may be stacked in the fashion described.

Figure 3:
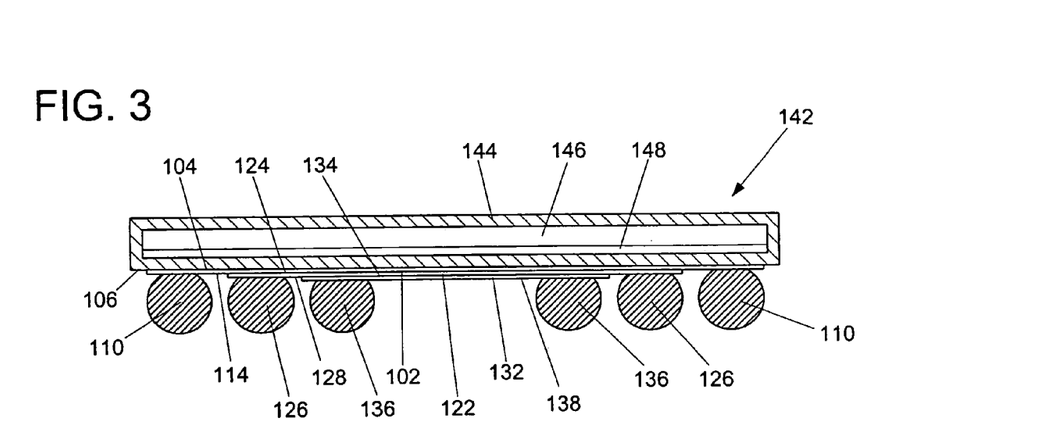
FIG. 3 is a side cross-sectional view of an embodiment of a microelectronic die assembly having a heat pipe, according to the present invention.
Figure 4:
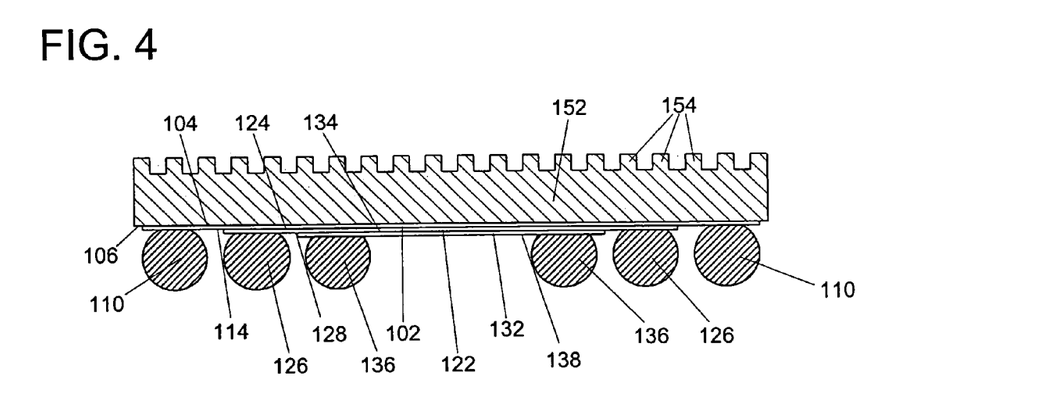
FIG. 4 is a side cross-sectional view of an embodiment of a microelectronic die assembly having a finned heat sink, according to the present invention.

Although FIG. 1 illustrates the heat dissipation device 108 as a heat sink, it may be any known the heat dissipation device. For example, as shown in FIG. 3, the heat dissipation device may be a heat pipe 142 comprising a sealed thermally conductive housing 144 having a hollow void 146 defined therein with a working fluid 148 disposed in the hollow void 146 Additionally, as shown in FIG. 4, the surface area of a heat dissipation device 152 can be increased by forming projections 154 in or on a second surface 156 of the heat dissipation device 152. The increased surface area by the projections 154 improves heat dissipation from the heat dissipation device 152.

Figure 5:
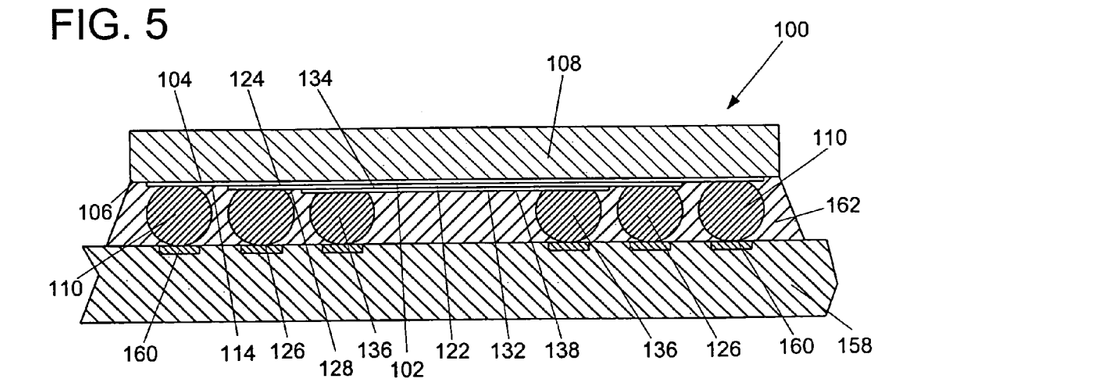
FIG. 5 is side cross-sectional view of a various embodiments of microelectronic die assemblies, according to the present invention.

As shown in FIG. 5, the microelectronic die assembly of the present invention (illustrated as microelectronic device assembly 100 of FIG. 1) may be electronically and physically attached to land pads 160 on a substrate 158 (such as an interposer, a motherboard, or the like) by the first microelectronic die interconnects 110, the second microelectronic die interconnects 126, and the third microelectronic die interconnects 136. The first, second, and third microelectronic die interconnects 110, 126, 136, respectively, may be shaped, altered, or other modified to be substantially planar at the points of contact with the substrate 158.

To mechanically and physically reinforce the first, second, and third microelectronic die interconnects 110, 126, 136, respectively, an underfill material 162, such as an epoxy material, may be disposed between the microelectronic die assembly 100 and the substrate 158. The underfill material 162 can increase the reliability of the microelectronic die assembly 100 by reducing the stress level caused by mismatch in the coefficients of thermal expansion between the various components of the microelectronic die assembly 100, as will be understood by those skilled in the art. Furthermore, the underfill material 162 may be a thermally conductive material, such that heat can be dissipated through the substrate 158. The thermally conductive material may be fabricated by adding non-electrical conductive fine particles to typical underfill materials. These particles are preferably highly thermally conductive, such as, but not limited to diamond powders and ceramic powders (such as aluminum nitride ceramic composites, boron nitride ceramic composites, and the like).

Figure 6:
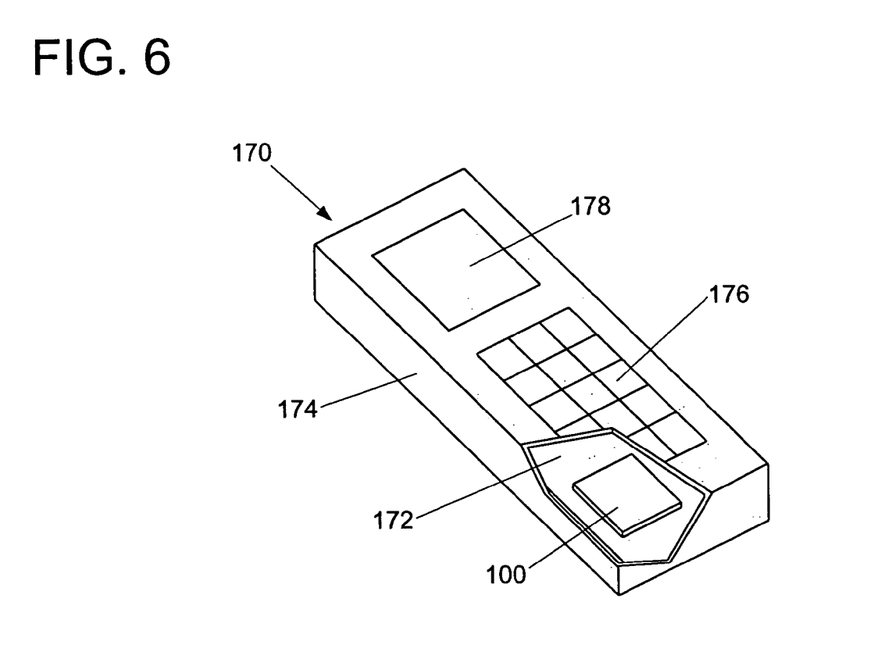
FIG. 6 is an oblique view of a computer system having a microelectronic assembly of the present integrated therein, according to the present invention.

The microelectronic device assemblies formed by the present invention, such as microelectronic device assembly 100 of FIG. 1, may be used in a hand-held device 170, such as a cell phone or a personal data assistant (PDA), as shown in FIG. 6. The hand-held device 170 may comprise a substrate 172, with the microelectronic assembly 100 attached thereto, within a housing 174. The substrate 172 may be attached to various peripheral devices including an input device, such as keypad 176, and a display device, such an LCD display 178.

Figure 7:
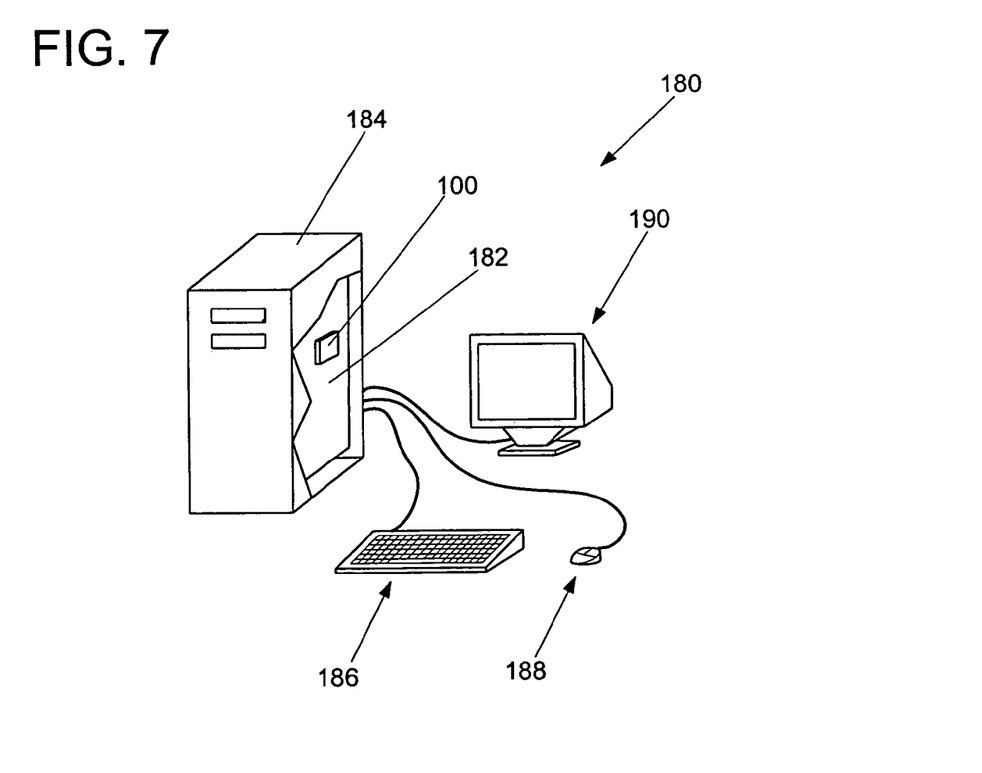
FIG. 7 is an oblique view of a hand-held system having a microelectronic assembly of the present integrated therein, according to the present invention.

The microelectronic device assemblies formed by the present invention, such as microelectronic device assembly 100 of FIG. 1, may also be used in a computer system 180, as shown in FIG. 7. The computer system 180 may comprise a motherboard 182 with the microelectronic assembly 100 attached thereto, within a housing or chassis 184. The motherboard 182 may be attached to various peripheral devices including inputs devices, such as a keyboard 186 and/or a mouse 188, and a display device, such as a CRT monitor 190.

The microelectronic device assemblies of the present invention have distinct advantages including, but not limited to, having a low profile package design suitable for cell phone and hand-held devices, no substrate is needed which reduces the cost of the assembly, the heat generated by the stacked dice can be easily dissipated by the heat dissipation device, and the heat dissipation device increases the rigidity of the assembly which allows a higher tolerance to bending of the assembly, such as when keypads are depressed on a cell phone.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic device assembly, comprising:
   a heat dissipation device having a first surface;
   a first microelectronic die having an active surface and a back surface, said first microelectronic die back surface attached to said heat dissipation device first surface;
   a first plurality of interconnect bumps attached to said first microelectronic die active surface, which extend about a periphery of said first microelectronic die active surface;
   a second microelectronic die having an active surface and a back surface, said second microelectronic die back surface attached to said first microelectronic die active surface between at least two of said first plurality of interconnect bumps; and
   a second plurality of interconnect bumps attached to said second microelectronic die active surface.

2. The microelectronic device assembly of claim 1, further comprising:
   a third microelectronic die having an active surface and a back surface, said third microelectronic die back surface attached to said second microelectronic die active surface; and
   a third plurality of interconnects attached to said third microelectronic die active surface.

3. The microelectronic device assembly of claim 1, wherein said heat dissipation device comprises a heat slug.

4. The microelectronic device assembly of claim 1, wherein said heat dissipation device comprises a heat pipe.

5. The microelectronic device assembly of claim 1, further including a thermally conductive adhesive disposed between said first microelectronic die and said heat dissipation device.

6. The microelectronic device assembly of claim 1, further including a thermally conductive adhesive disposed between said first microelectronic die and said second microelectronic die.

7. An assembly, comprising:
   a microelectronic device assembly including:
      a heat dissipation device having a first surface;
      a first microelectronic die having an active surface and a back surface, said first microelectronic die back surface attached to said heat dissipation device first surface;
      a first plurality of interconnect bumps attached to said first microelectronic die active, which extend about a periphery of said first microelectronic die active surface;
      a second microelectronic die having an active surface and a back surface, said second microelectronic die back surface attached to said first microelectronic die active surface between at least two of said first plurality of interconnect bumps;
      a second plurality of interconnect bumps attached to said second microelectronic die active surface; and
   a substrate with said first plurality of interconnect bumps and said second plurality of interconnect bumps attached to said substrate.

8. The assembly of claim 7, further comprising an underfill material disposed between said microelectronic device assembly and said substrate.

9. The assembly of claim 8, wherein said underfill material is a thermally conductive underfill material.

10. The microelectronic device assembly of claim 7, wherein said heat dissipation device comprises a heat slug.

11. The microelectronic device assembly of claim 7, wherein said heat dissipation device comprises a heat pipe.

12. The microelectronic device assembly of claim 7, further including a thermally conductive adhesive disposed between said first microelectronic die and said heat dissipation device.

13. The microelectronic device assembly of claim 7, further including a thermally conductive adhesive disposed between said first microelectronic die and said second microelectronic die.

14. A microelectronic system, comprising:
   a substrate within a housing; and
   at least one microelectronic device assembly attached to said substrate, including:
      a heat dissipation device having a first surface;
      a first microelectronic die having an active surface and a back surface, said first microelectronic die back surface attached to said heat dissipation device first surface;
      a first plurality of interconnects attached to said first microelectronic die active surface, which extend about a periphery of said first microelectronic die active surface;

a second microelectronic die having an active surface and a back surface, said second microelectronic die back surface attached to said first microelectronic die active surface between at least two of said first plurality of interconnect bumps; and a second plurality of interconnect bumps attached to said second microelectronic die active surface.

15. The system of claim 14, further comprising an input device in electronic communication with said substrate.

16. The system of claim 14, further comprising a display device in electronic communication with said substrate.

17. The system of claim 14, further comprising an underfill material disposed between said microelectronic device assembly and said substrate.

18. The system of claim 17, wherein said underfill material is a thermally conductive underfill material.

19. The system of claim 14, wherein said heat dissipation device comprises a heat slug.

20. The system of claim 14, wherein said heat dissipation device comprises a heat pipe.

21. The system of claim 14, further including a thermally conductive adhesive disposed between said first microelectronic die and said heat dissipation device.

22. The system of claim 14, further including a thermally conductive adhesive disposed between said first microelectronic die and said second microelectronic die.

* * * * *

UNITED STATES PATENT AND TRADEMARK OFFICE
CERTIFICATE OF CORRECTION

PATENT NO. : 6,965,163 B2  Page 1 of 1
DATED : November 15, 2005
INVENTOR(S) : Chiu It is certified that error appears in the above-identified patent and that said Letters Patent is hereby corrected as shown below:

Column 6,
Line 23, after "active", insert -- surface --.

Signed and Sealed this

Sixteenth Day of May, 2006

JON W. DUDAS
*Director of the United States Patent and Trademark Office*